United States Patent [19]
Huang

[11] Patent Number: 5,936,449
[45] Date of Patent: Aug. 10, 1999

[54] DYNAMIC CMOS REGISTER WITH A SELF-TRACKING CLOCK

[75] Inventor: Eddy C. Huang, San Jose, Calif.

[73] Assignee: Winbond Electronics Corporation, San Jose, Calif.

[21] Appl. No.: 08/924,973

[22] Filed: Sep. 8, 1997

[51] Int. Cl.[6] ................................................ H03K 19/17
[52] U.S. Cl. .......................... 327/211; 327/210; 327/212; 327/200; 327/199; 326/94; 326/95; 326/98
[58] Field of Search .................................... 327/211, 202, 327/208, 199, 210, 212, 200; 326/94, 95, 97, 98, 90–93, 96, 99

[56] References Cited

U.S. PATENT DOCUMENTS

| | | | |
|---|---|---|---|
| 4,554,467 | 11/1985 | Vaughn | 327/211 |
| 4,800,300 | 1/1989 | Walters, Jr. | 327/210 |
| 5,561,694 | 10/1996 | Fifield | 326/86 |
| 5,796,282 | 8/1998 | Sprague | 327/210 |

*Primary Examiner*—Timothy P. Callahan
*Assistant Examiner*—April Giles
*Attorney, Agent, or Firm*—Allston L. Jones

[57] ABSTRACT

A dynamic CMOS register implemented on a silicon die that requires the use of only two input signals, a data-in signal and an inverse clock signal. Each embodiment includes a self-timed clock circuit having a CMOS PNN tier of FETs with a P channel and two N channels connected serially (sources of P channel at one end connected to bus and N channel at the other end connected to ground, and gate of end N channel connected to bus), a first inverter to receive inverse clock with output connected to gate of P channel, a second inverter connected to drain of P channel, and a NOR gate with one input receiving inverse clock, second input connected to output of second inverter and output connected to gate of center N channel. In one embodiment, a single self-timed clock circuit interfaces with and controls a plurality of CMOS registers. In each of two other embodiments, the self-timed clock circuit interfaces with one or two additional CMOS PNN tiers of FETs with a P channel and two N channels connected serially and an output latch forming a CMOS register that operates in a precharge phase and an evaluation phase.

7 Claims, 4 Drawing Sheets

DYNAMIC CMOS REGISTER WITH A SELF-TRACKING CLOCK

FIELD OF THE INVENTION

The present invention relates to the implementation of CMOS gates, and more specifically to dynamic gates that are self timing and include an automatically resetting clock.

BACKGROUND OF THE INVENTION

In a typical static CMOS register design there are two stages: a master latch stage and a slave latch stage. Additionally, the prior art static CMOS registers require the use of both PMOS and NMOS FETs in each pass gate within each stage. That inclusion of both PMOS and NMOS devices in each pass gate requires that two clock signals, clock and inverse clock, be provided to both pass gates in such static registers.

The use of two serially connected stages, the master stage and slave stage, plus the inclusion of a PMOS device in each stage contributes a double factor to the setup time of the register. Each of the master stage and the slave stage contributes a set-up time since the data has to pass through the master stage with a first set-up time before the output data is provided to the slave stage with a second set-up time. Additionally, the need to provide both the clock and inverse clock signals to both the master and slave stages, as well as the inclusion of both PMOS and NMOS devices in both stages of the static register, requires the allocation of wafer surface area to provide those signal traces and components to implement that design.

It would be desirable to have a register that includes a single stage, only requires the use of a single clock signal and only uses PMOS devices during a precharge phase that occurs within an initial clock pulse so that the actual switching setup time during an evaluation phase is determined only by the switching time of NMOS devices. It would further be advantageous to have a self-timed clock circuit to reset the clock level to zero during the evaluation phase. It would be a further advantage to have a self-timed clock circuit that could be used to interface with multiple registers on the same die. The dynamic register of the present invention provides all of these advantages over the static registers of the prior art.

SUMMARY OF THE INVENTION

The present invention includes several embodiments of a dynamic CMOS register implemented on a silicon die that requires the use of only two input signals, a data-in signal and an inverse clock signal. A first embodiment includes two CMOS PNN tiers of FETs each having a P channel FET and two N channel FETs connected serially, source and drain, with each P channel at one end of the respective tier with the source disposed to be connected to a positive bus voltage, and with each N channel FET at the other end of the respective tier with the drain disposed to be connected to ground. The gate of the N channel FET on the end of the tier in the first tier is disposed to receive the data-in signal, and the gate of the N channel FET on the end of the tier in the second tier is disposed to be connect to the positive bus voltage.

The first embodiment further includes an output latch with the input terminal connected to the drain of the P channel FET of the first tier, and the output terminal of the latch is the output terminal of the first embodiment dynamic CMOS register. Additionally there is a first inverter disposed to receive the inverse clock signal on the input terminal with the output terminal connected to the gates of the P channel FETs in both CMOS PNN tiers.

Further, the first embodiment includes a self-timed clock circuit made up of the second CMOS PNN tier of FETs, a second inverter with the input terminal connected to the drain of the P channel FET of the second CMOS PNN tier, and a NOR gate with one input terminal connected to the input terminal of the first inverter, the second input terminal connected to the output terminal of the second inverter, and the output terminal connected to the gate of each of the center N channel FETs of both CMOS PNN tiers. In this configuration the signal on the output terminal of the NOR gate is a self-timed clock pulse, a positive going pulse having a duration time equal to the sum of the settling times of the center N channel FET in the second CMOS PNN tier, the second inverter and the NOR gate when the inverse clock signal makes a transition from a high signal level to a low signal level.

The second embodiment of the present invention is similar to the first embodiment with the addition of a third CMOS PNN tier of FETs and a third inverter, and the latch of the first embodiment replaced with a cross-connected pair of NAND gates. The cross-coupled NAND gates have the output terminal of each connected to one of the input terminals of the other, and the output terminal of each of the NAND gates serves as an output terminal of the register.

In this embodiment the first and second tiers of FETs are connected as in the first embodiment with the drain of the P channel FET of the first tier connected to the input terminal of one of the NAND gates not connected to the output terminal of the other NAND gate, and the output terminal of the NAND gate so connected to the P channel FET in the first tier is the data-out terminal of the register.

The third tier of FETs in the second embodiment is constructed serially as are the other two tiers, and also disposed to be connected between positive bus voltage and ground as are the other tiers. Further, the drain of the P channel FET in the third tier is connected to the second NAND gate, namely the input terminal that is not connected to the output terminal of the first NAND gate, and the output terminal of the second NAND gate so connected to the P channel FET in the third tier is the inverse data-out terminal of the register. Further, the gate of the center N channel FET in the third tier is connected to the output terminal of the NOR gate, and the gate of the end N channel FET of the third tier is connected to the output terminal of the third inverter. Here too, the signal on the output terminal of the NOR gate is a self-timed clock pulse, a positive going pulse having a duration time equal to the sum of the settling times of the center N channel FET in the second CMOS PNN tier, the second inverter and the NOR gate when the inverse clock signal makes a transition from a high signal level to a low signal level.

The third embodiment of the present invention is an extension of either the first or second embodiments with the second CMOS PNN tier of FETS, the first and second inverters and the NOR gate interconnected with each other, interfacing with a plurality of CMOS registers on the same die. This is possible since this circuit performs functions that are common to all of the registers to which it is interfaced.

The fourth embodiment of the present invention is the circuit for generating the self-timed clock pulse. This is the circuit of the previously identified second CMOS PNN tier of FETs, the first and second inverters and the NOR gate interconnected with each other as described above in each of the other embodiments without being interfaced with the various registers of any description.

DESCRIPTION OF THE PRESENT INVENTION

Figure 1:
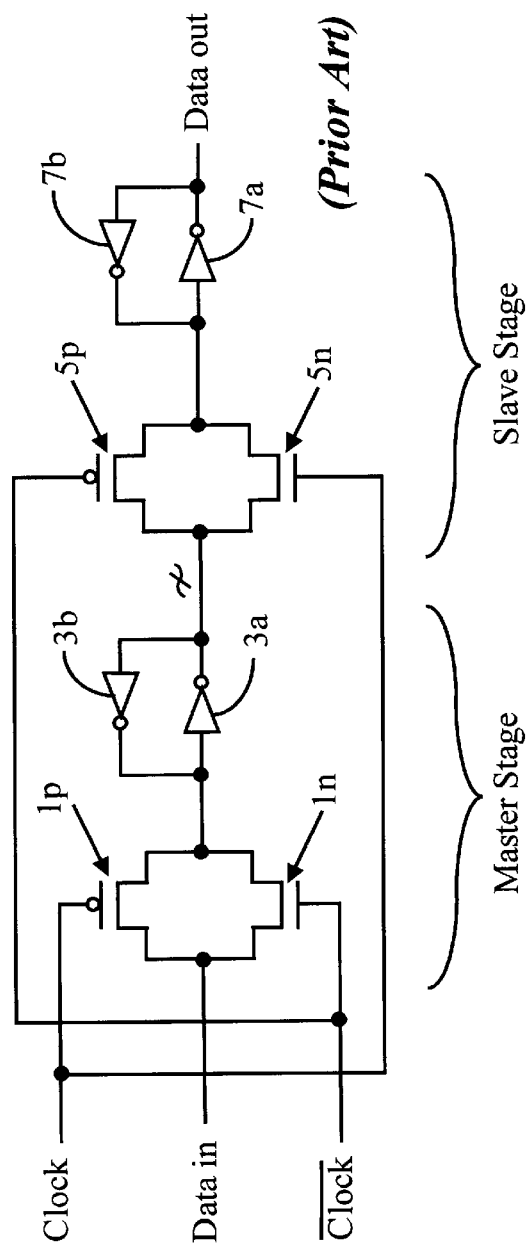
FIG. 1 is a schematic diagram of the internal circuit a static CMOS register of the prior art.

Referring first to FIG. 1 there is shown a schematic circuit of the CMOS circuitry of a typical static register of the prior art. This register consists of two stages: a master stage and a slave stage. The master stage includes a PN pass gate, or transfer gate, of PMOS FET 1P connected in parallel with an NMOS FET 1N with the source and drain of each connected to each other, respectively. The connected sources of 1P and 1N form the input terminal of the master stage to receive the incoming data. The gates of each of PMOS and NMOS FETs 1P and 1N are also disposed to receive the clock signal and inverse clock signal, respectively. To complete the master stage, there is a latch shown as a pair of cross-coupled inverters 3a and 3b connected serially to the connected drains of 1P and 1N, having the opposite end of the latch marked "x" which is the output point of the master stage.

The slave stage is serially connected to the output point of the master stage and is substantially the same as the master stage with FETs 5P and 5N similarly connected in parallel to form a second PN pass gate and then serially connected to cross-coupled inverters 7a and 7b to form a second latch. So that the slave stage is conductive in the alternative clock phase to that of the master stage, the gates of 5P and 5N are disposed to receive the inverse clock signal and clock signal, respectively, which is the opposite of the signals applied to the gates of 1P and 1N in the master stage.

Figure 2:
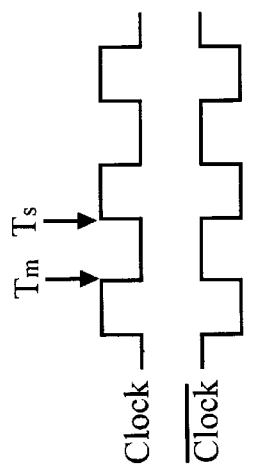
FIG. 2 illustrates waveforms of the clock and inverse clock signals that also shows thereon the transition times for each of the master and slave stages of the prior art register of FIG. 1.

To illustrate the operation of the prior art register of FIG. 1, FIG. 2 is included to show the clock waveforms: the clock signal and the inverse clock signal.

Additionally, the clock edge transitions that initiate the active periods of each of the master and slave stages, respectively, is shown with the notations of $T_M$ and $T_S$ on those waveforms.

Thus, in the period during which the master stage is active the clock signal is low and the inverse clock signal is high, turning 1P and 1N both on to pass the data on their connected sources through to each of their connected drains and then through latch 3a–3b to "x" where it is held by the latch until the next clock cycle so that it is available when the slave stage is activated. Similarly, in the period during which the slave stage is active the clock signal is high and the inverse clock signal is low, turning 5P and 5N both on to pass the data at "x" through to each of their connected drains and then through latch 7a–7b to the output data terminal where it is held by the second latch until the next clock cycle during which the slave stage is activated.

The sampling of the data on the input terminal of either stage is said to be sampled on the appropriate edge transition (i.e., rising or falling edge depending on the phase of the clock and the clock signal triggering the transition) as indicated above.

Similarly, since the inverse clock signal is controlling the operation of 1N, and it is the rising edge of the inverse clock signal that begins to switch 1N on, the rising edge of the inverse clock signal is said to be the timing pulse for activating the master stage.

At the end of the clock pulse that has turned the respective stage on, the reversing transition begins to turn the active stage off and the inactive stage on, and the corresponding latch holds the data transferred through it during the active period and until the next phase of the clock again activates the corresponding stage.

The configuration of FIG. 1 presents several problems as a faster clock is used to trigger the operation of the register. In this two stage arrangement there are two contributing factors that limit the overall speed of the register. One is the use of two serially connected stages that each have their own set-up time with those set-up times being serial, not in parallel. The other is a certain amount of delay contributed by the inclusion of the extra loading of a PMOS device in each stage. The overall delay occurs from having to be sure that the one stage is fully on and settled, and the other stage is fully off and settled before a data transfer is made. Given the inherent set-up time in such a device, the period of the clock signal absolutely can not be less than twice the set-up time of the PN transfer gate plus some time for the transfer of the data through the latches and the settling of the latches.

For purposes of the discussions of FIGS. 3 through 6, the orientation of the source and drain terminals of the CMOS FETs in the various embodiments of the present invention, are the orientations that are considered standard when analyzing the operation of CMOS circuits. From a purely physical perspective it is immaterial which is considered the source and which is considered the drain. Thus, if one were to reverse the connections of the source and drain in the PNN tiers of CMOS FETs of the various embodiments of the present invention, the circuit operation would not vary from that described below.

Figure 3:
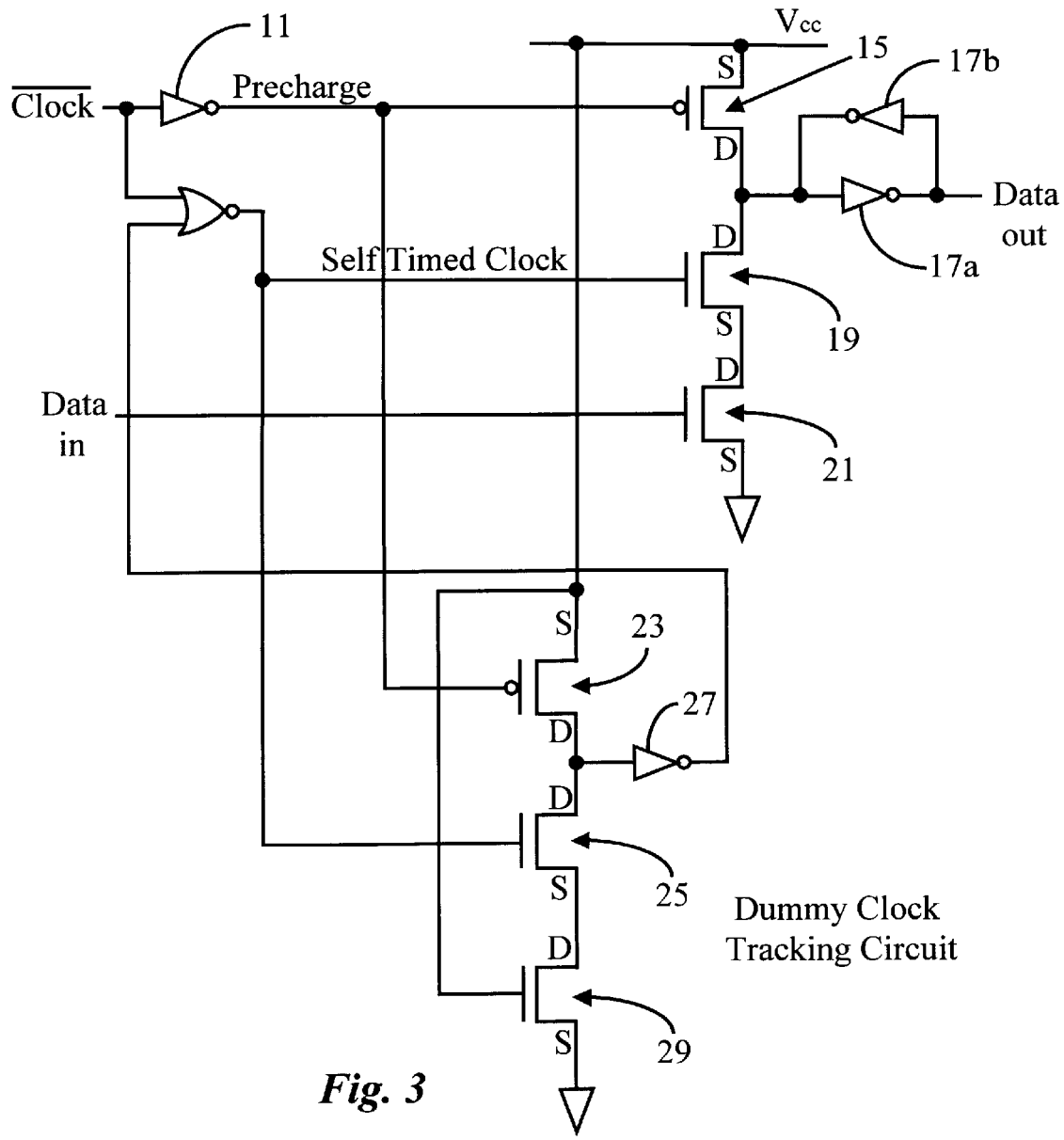
FIG. 3 is a schematic diagram of the internal circuit of one embodiment of the dynamic CMOS register of the present invention.

FIG. 3 illustrates one embodiment of dynamic register of the present invention. As will be seen from the following discussion, this register does not have two serially connected stages, a master stage and a slave stage as in the prior art with the data having to pass through a first stage before it is available to the second stage. Here, there is one stage that operates in two phases: a precharge phase and an evaluation phase. To minimize the set-time limitations of the prior art, the present invention register only utilizes P channel devices, and no N channel devices, in the precharge phase, while only N channel devices are utilized in the evaluation phase. It is during the evaluation phase that the data signal is presented at the output terminal of the register.

From FIG. 3 it can be seen that there are only two input signals: a data-in signal and an inverse clock signal (there is no need for the second clock signal). The inverse clock signal is applied to an inverter 11 to generate the precharge signal. The precharge signal from inverter 11 is then applied to the gate of PMOS FET 15 that has the source connected to bus (i.e., $V_{cc}$) and the drain connected to the input terminal of a latch consisting of cross-connected inverters 17a and 17b, and a series connection of NMOS FETs 19 and 21 with the source of NMOS 21 connected to ground. The gate of NMOS 21 is disposed to receive the input data signal.

Additionally, there is a dummy clock tracking circuit consisting of five components. Three of those components are three FETs, PMOS 23, NMOS 25 and NMOS 29, that are connected serially, drain and source, and have been designed to have operational characteristics that closely match those of the serial connection of FETs PMOS 15, NMOS 19 and NMOS 21. The source of PMOS 23 is connected to $V_{cc}$, as is the source of PMOS 15, and the source of NMOS 29 is connected to ground, as is the drain of NMOS 21, thus this series connection, drain and source, of these three components of the dummy clock tracking circuit are connected in parallel with the drain and source series connection of PMOS 15, NMOS 19 and NMOS 21. The gate of NMOS 29 is also connected to $V_{cc}$, to keep NMOS 29 active at all times with NMOS 29 having been included to balance the characteristics of NMOS 21. The dummy clock tracking circuit also includes a second inverter 27 with the input terminal connected to the drain of PMOS 23. The fifth component of the dummy clock tracking circuit is a NOR gate 13 with one input terminal connected to receive the inverse clock signal and the other input terminal connected to the output terminal of inverter 27 with a self-timed clock signal generated on the output terminal of NOR gate 13. The output terminal of NOR gate 13 is connected to the gate of both NMOS 19 and NMOS 25 to provide them with the self-timed clock signal.

Given the configuration of FIG. 3, when the inverse clock signal is high, the dynamic register is in the precharge phase, and conversely, when the inverse clock signal is low the dynamic register is in the evaluation phase.

Thus, when the inverse clock signal is high (precharge phase), the output of inverter 11 is low which pulls down the gates of PMOS 15 and PMOS 23, thus pulling the input of the latch of inverters 17a and 17b, and inverter 27 high (to $V_{cc}$). Thus, in the precharge phase, the data-out signal from the latch of inverters 17a and 17b is low. Looking at the two input signals to NOR gate 13 during the precharge phase, the inverse clock signal on one of those terminals is high, while the signal from inverter 27 on the other of those terminals is low, thus the state of the self-timed clock signal from NOR gate 13, is low. With the self-timed clock signal low, NMOS 19 is off, as is NMOS 25. Thus during the precharge phase, regardless of the level of the data signal on the gate of NMOS 21, the data-out signal from the latch of inverters 17a and 17b is reset low, and the output of inverter 27 does not change state.

When the inverse clock signal goes low (evaluation phase) both inputs to NOR gate 13 are low, thus switching the self-timed clock signal high causing NMOS 19 and 25 each to drain, and the output signal from inverter 11 goes high cutting off PMOS 15 and 23. Therefore, the state of the data signal applied to the gate of NMOS 21 controls the state of the input terminal of the latch of inverters 17a and 17b. The high signal level of the output signal from NOR gate 13 on the gate of NMOS 25 causes NMOS 25 to drain, and, since NMOS 29 does not effect the state of the input terminal of inverter 27 (NMOS 29 is always conducting with NMOS 29 being provided simply to complete the match of the P and N channel devices 15, 19 and 21), the draining of NMOS 25 pulls the input terminal of inverter 27 low, forcing the output of inverter 27 high which is applied to the second input terminal of NOR gate 13. Once the switching time of NMOS 25, and inverter 27 has been completed, the input terminals of NOR gate 13 are now one low and one high resulting in the output terminal of NOR gate 13 going low, turning NMOSs 19 and 25 off.

Figure 4:
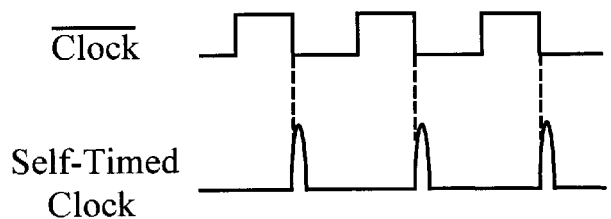
FIG. 4 illustrates waveforms of the inverse clock and self-timed clock signals for use by the present invention embodiments of FIGS. 3 and 5.

In FIG. 4 the inverse clock signal and the self-timed clock signal are shown in relation to each other. Note that the self-timed clock signal is a series of pulses each triggered by the transition of the inverse clock signal from high to low with the duration of the self-timed clock signal determined by the switching time of NMOS 25, inverter 27 and NOR gate 13.

Figure 5:
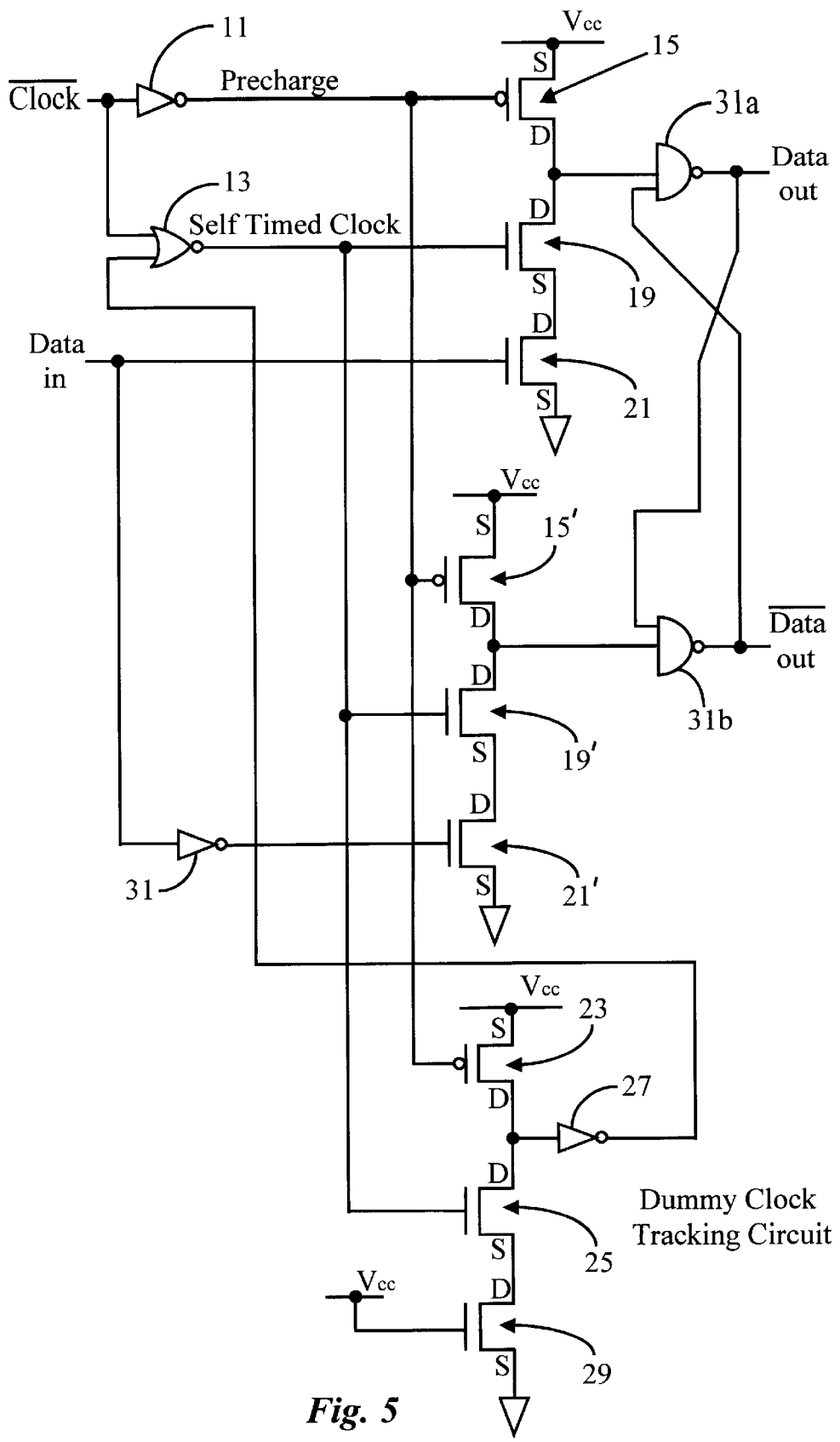
FIG. 5 is a schematic diagram of a second embodiment of the dynamic CMOS register of the present invention.

FIG. 5 illustrates another embodiment of dynamic register of the present invention. Here, as with the circuit of FIG. 3, this register has a single stage that operates in two phases. Also, as in the embodiment of FIG. 3, to minimize the set-up time limitations this register also only utilizes P channel devices, and no N channel devices, in the precharge phase, while only N channel devices are utilized in the evaluation phase and it is during the evaluation phase that the data signal is presented at the output terminals of the register.

Further, as in the embodiment of FIG. 3, the embodiment of FIG. 5 only has two input signals: a data-in signal and an inverse clock signal (again there is no need for the second clock signal). Before explaining in detail the operation of this embodiment, it should be noted that FIG. 5 includes all of the components connected in the same way as in FIG. 3 with a different output latch configuration and an additional serially connected tier of PMOS and NMOS devices. Those components that are the same have the same reference numbers as those in FIG. 3.

The similarities between the circuit of this embodiment and that of FIG. 3 are inverter 11, the tier of serially connected PMOS 15 and NMOSs 19 and 21, NOR gate 13 and the dummy clock circuit, all of which operate exactly as described above with respect to FIG. 3. What is added here is a third tier of PMOS and NMOS FETs 15', 19' and 21', a third inverter 31, and an output latch of a different design that consists of cross-connected NAND gates 31a and 31b that are provided with input data signals from the drain of NMOS 19 and 19', respectively.

As mentioned above, the tier of PMOS FET 15 and NMOS FETs 19 and 21, are substantially matched to the similar tier in the dummy circuit. Here, the third tier of PMOS 15' and NMOSs 19' and 21', is also substantially matched to those of the other two tiers.

In FIG. 5 the third tier of PMOS and NMOS FETs is also connected between bus and ground as are the other two tiers of similar devices with the precharge signal from inverter 11 also connected to the gate of PMOS 15', and the self-timed clock signal from NOR gate 13 also connected to the gate of NMOS 19'. Additionally, the data-in signal, in addition to being applied to the gate of NMOS 21, is also applied to third inverter 31 with the inverse data-in signal applied to the gate of NMOS 21' from inverter 31. The second input terminal of each of NAND gates 31a and 31b is connected to the output terminal of the other one of NAND gates 31a and 31b, thus providing the output latch function.

In operation, the register of FIG. 5 is very similar to that of FIG. 3 with the additional PMOS-NMOS tier being provided to accommodate the different latch design of NAND gates 31a and 31b. Thus, during the precharge phase, an inverse clock signal is applied to inverter 11 to generate the precharge signal. The precharge signal from inverter 11 is then applied to the gate of PMOS FETs 15, 15' and 23 to precharge the corresponding input terminals of NAND gates 31a and 31b, and inverter 27 high. The precharge value being applied to NAND gates 31a and 31b has no effect on those gates and does not reset the state of the data-out and inverse data-out from those gates during the precharge phase. In this configuration the state of the output signals from latch 31a and 31b only changes during the evaluation phase.

As in the embodiment of FIG. 3, the dummy clock tracking circuit of FIG. 5 operates in the same way. Thus during the precharge phase, the input signals to NOR gate 13 will be one high and one low, thus the self timed clock signal from NOR gate 13 is low.

When the inverse clock signal goes low and the evaluation phase begins, both terminals of NOR gate 13 are initially low causing the self-timed clock signal to go high which activates NMOS 19 and 19', while the signal from inverter 11 now goes high cutting off PMOS 15, 15' and 23. Thus, since the data-in signal is on the gate of NMOS 21 and the inverse data-in signal is on the gate of NMOS 21', one of NMOS 21 and 21' will be activated while the other is not, thus if the data-in signal level is the same as the previous data-out signal level the latch of NAND gates 31a and 31b change state and the data-out signal level changes state.

Further during the evaluation phase, as discussed above in relation to FIGS. 3 and 4, once the combined settling time of NMOS 25, inverter 27 and NOR gate 13 have had time to take place, the output level of inverter 27 goes high and the output level of NOR gate 13 will go low generating a self-timed clock signal as shown in FIG. 4.

Figure 6:
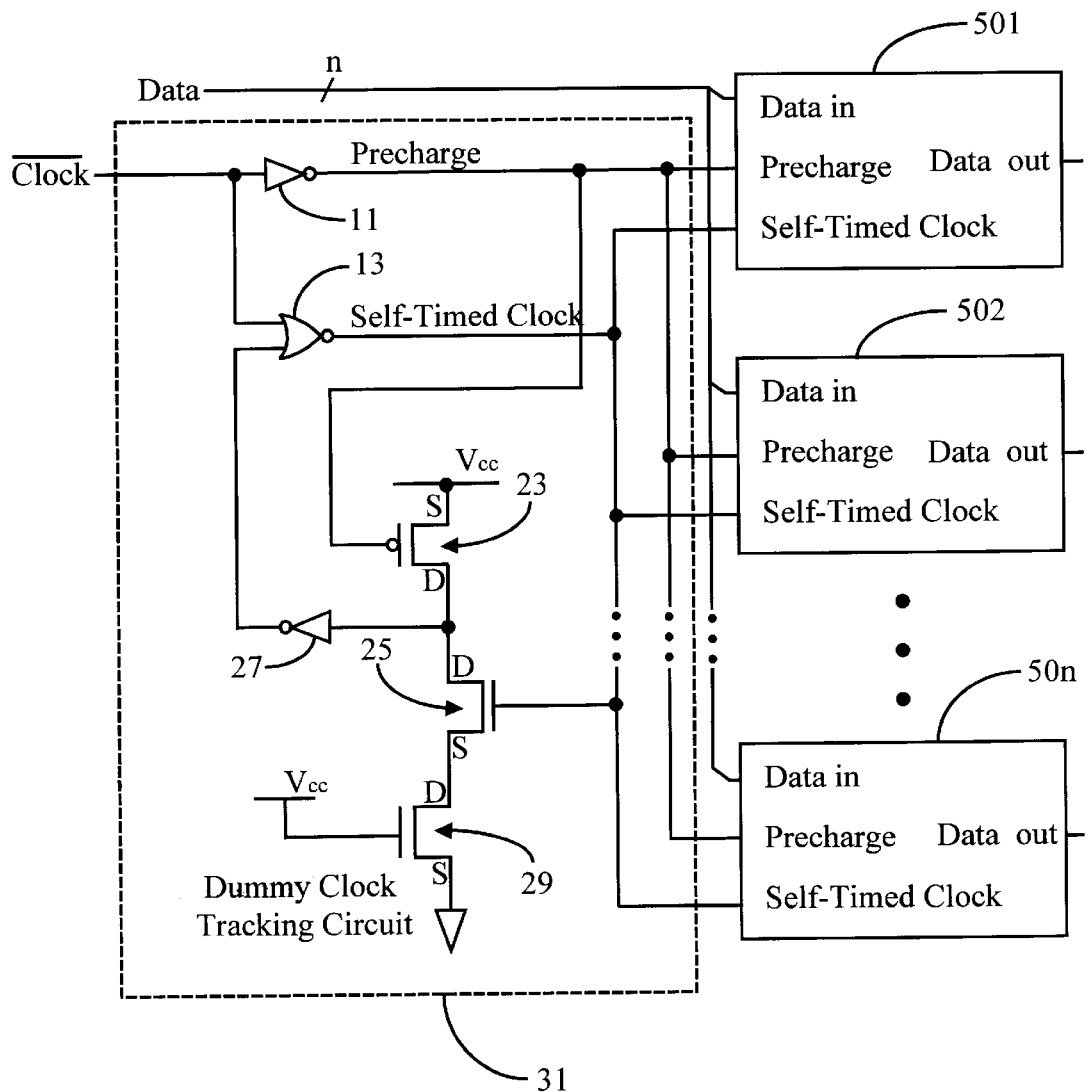
FIG. 6 is a combined schematic and block diagram illustrating the clock and clock reset circuit of the present invention and the interfacing of that circuit with multiple registers of the present invention on the same die.

FIG. 6 is provided to illustrated a number of registers on a single die and the sharing of a common stage 31 that includes inverter 11 to generate the precharge signal, and dummy clock circuit and NOR gate 13 to generate the self-timed clock signal, both of which are the same for all registers on the die. In this example, the registers $50_1$, $50_2$ . . . $50_n$ can be of any type, for example simply the PNN tier of PMOS 15, and NMOSs 19 and 21, together with latch 17a–17b from FIG. 3; or the PMOS-NMOS tiers 15, 19, 21 and 15', 19' and 21', together with the latch of 31a–31b from FIG. 5. Thus, the designs of the present invention offer a great deal of economy in the real estate occupied by multiple registers on the same die.

Given that the physical closeness of the various PMOS-NMOS tiers on the surface of a die impacts the possible characteristic match of those various tiers with each other, it may be necessary in some designs to use more than one common stage 31 to interface with various groupings of registers $50_x$.

Given the present invention register designs described above, there are several advantages over the static register of the prior art. Those advantages are clear from the above discussion, namely:

a. reduced settling time since there is a single stage design, unlike the master-slave two stage design of the prior art;

b. the dummy clock tracking circuit and the generation of the self-timed clock signal eliminates voltage, temperature and process dependencies in deciding the optimal pulse width of the clock to transfer the data-out from the register;

c. the use of only a single clock signal (e.g., inverse clock signal in the examples of FIGS. 3, 5 and 6) to each register on the die saves real estate and therefore permits the inclusion of more circuits on a same size die;

d. the dynamic circuit of the present invention offers faster switching speed than the prior art registers that include PNN pass gates in both the master and slave stages since the present invention has only a single stage that operates in two phases with the use of P channel devices limited to the precharge phase when speed is not critical and uses only N channel devices in the evaluation phase when switching speed can be more critical, thus allowing the use of the present invention gates at higher clock rates than available with prior art registers; and e. a single dummy clock tracking circuit and self-timed clock generation can be used for clusters of registers on the same die thus significantly reducing overhead layout area on a die.

While the present invention has been described in several embodiments, it is contemplated that persons skilled in the art, upon reading the preceding descriptions and studying the drawings, will realize various alternative approaches to the implementation of the present invention. It is therefore intended that the following appended claims be interpreted as including all such alterations and modifications that fall within the true spirit and scope of the present invention.

What is claimed is:

1. A dynamic CMOS register implemented on a silicon die and having only two input signals, a data-in signal and an inverse clock signal, said dynamic CMOS register comprising:

a first CMOS PNN tier of FETs implemented on said die in a first selected location with each FET having a source, a drain and a gate, said first CMOS PNN tier including:
  a first P channel FET having said source disposed to be connected to a positive bus voltage;
  a first N channel FET having said drain connected to said drain of said first P channel FET; and
  a second N channel FET having said drain connected to said source of said first N channel FET, said drain disposed to be connected to ground, and said gate disposed to receive said data-in signal;

an output latch having an input terminal and an output terminal with said input terminal connected to said drain of said first P channel FET of said first CMOS PNN tier, and said output terminal being an output terminal of said dynamic CMOS register;

a first inverter having an input terminal and an output terminal with said input terminal disposed to receive said inverse clock signal and said output terminal connected to said gate of said first P channel FET of said first CMOS PNN tier; and a self-timed clock circuit including:
  a second CMOS PNN tier of FETs implemented on said die in a second selected location with each FET having a source, a drain and a gate, said second CMOS PNN tier including:
    a second P channel FET having said source connected to said source of said first P channel FET of said first CMOS PNN tier and said gate connected to said output terminal of said first inverter;
    a third N channel FET having said drain connected to said drain of said second P channel FET; and
    a fourth N channel FET having said drain connected to said source of said second N channel FET, said source disposed to be connected to ground, and said gate connected to said source of each of said first and second P channel FETs;
  a second inverter having an input terminal and an output terminal with said input terminal connected to said drain of said second P channel FET of said second CMOS PNN tier; and a NOR gate having a first input terminal, a second input terminal, and an output terminal, said first input terminal connected to said input terminal of said first inverter, said second input terminal connected to said output terminal of said second inverter, and said output terminal connected to said gate of each of said first and third N channel FETs of said first and second CMOS PNN tiers, respectively;

wherein a signal on said output terminal of said NOR gate, namely a self-timed clock pulse, is a positive going pulse having a duration time equal to the sum of the settling times of said third N channel FET, said second inverter and said NOR gate when said inverse clock signal makes a transition from a high signal level to a low signal level.

2. A dynamic CMOS register as in claim 1 wherein said second selected location is physically in close proximity on said die to said first selected location to facilitate a close match of the performance characteristics of said first and second CMOS PNN tiers.

3. A dynamic CMOS register implemented on a silicon die and having only two input signals, a data-in signal and an inverse clock signal, said dynamic CMOS register comprising:

a first CMOS PNN tier of FETs implemented on said die in a first selected location with each FET having a source, a drain and a gate, said first CMOS PNN tier including:
a first P channel FET having said source disposed to be connected to a positive bus voltage;
a first N channel FET having said drain connected to said drain of said first P channel FET; and
a second N channel FET having said drain connected to said source of said first N channel FET, said source disposed to be connected to ground, and said gate disposed to receive said data-in signal;

a second CMOS PNN tier of FETs implemented on said die in a second selected location with each FET having a source, a drain and a gate, said first CMOS PNN tier including:
a second P channel FET having said source connected to said source of said first P channel FET of said first CMOS PNN tier;
a third N channel FET having said drain connected to said drain of said second P channel FET; and
a fourth N channel FET having said drain connected to said source of said third N channel FET, and said source connected to said source of said second N channel FET of said first CMOS PNN tier;

an output latch comprising:
a first NAND gate having a first input terminal, a second input terminal and an output terminal with said first input terminal connected to said drain of said first P channel FET of said first CMOS PNN tier, and said output terminal being a data-out terminal of said dynamic CMOS register; and
a second NAND gate having a first input terminal, a second input terminal and an output terminal with said first input terminal connected to said drain of said second P channel FET of said second CMOS PNN tier, said second input terminal connected to said output terminal of said first NAND gate, and said output terminal connected to said second input terminal of said first NAND gate and being an inverse data-out terminal of said dynamic CMOS register;

a first inverter having an input terminal and an output terminal with said input terminal disposed to receive said inverse clock signal and said output terminal connected to said gate of said first and second P channel FETs of said first and second CMOS PNN tiers, respectively;

a second inverter having an input terminal and an output terminal with said input terminal disposed to receive said data-in signal and said output terminal connected to said gate of said fourth N channel FET of said second CMOS PNN tier; and a self-timed clock circuit including:
a third CMOS PNN tier of FETs implemented on said die in a third selected location with each FET having a source, a drain and a gate, said third CMOS PNN tier including:
a third P channel FET having said source connected to said source of said first P channel FET of said first CMOS PNN tier and said gate connected to said output terminal of said first inverter;
a fifth N channel FET having said drain connected to said drain of said third P channel FET; and
a sixth N channel FET having said drain connected to said source of said fifth N channel FET, said source disposed to be connected to ground, and said gate connected to said source of each of said first P channel FET;

a third inverter having an input terminal and an output terminal with said input terminal connected to said drain of said third P channel FET of said third CMOS PNN tier; and a NOR gate having a first input terminal, a second input terminal, and an output terminal, said first input terminal connected to said input terminal of said first inverter, said second input terminal connected to said output terminal of said third inverter, and said output terminal connected to said gate of each of said first, third and fifth N channel FETs of said first, second and third CMOS PNN tiers, respectively;

wherein a signal on said output terminal of said NOR gate, namely a self-timed clock pulse, is a positive going pulse having a duration time equal to the sum of the settling times of said fifth N channel FET, said third inverter and said NOR gate when said inverse clock signal makes a transition from a high signal level to a low signal level.

4. A dynamic CMOS register as in claim 3 wherein said second and third selected locations are physically in close proximity on said die to said first selected location to facilitate a close match of the performance characteristics of said first, second and third CMOS PNN tiers.

5. A dynamic CMOS die comprising:
a plurality of dynamic CMOS registers each including a PNN tier of CMOS devices and each having a separate data-in input terminal to receive data intended only for the corresponding dynamic CMOS register, a precharge signal input terminal, a self-timed clock input terminal, and a separate data-out output terminal; and
a dummy clock tracking circuit connected to each of said plurality of dynamic CMOS registers connected to said precharge signal input terminal and said self-timed clock input terminal of each of said plurality of dynamic CMOS registers to provide a common precharge signal and a common self-timed clock signal to each of said plurality of dynamic CMOS registers, respectively, said dummy clock tracking circuit comprising:
a first inverter having an input terminal and an output terminal with said input terminal disposed to receive an inverse clock signal and said output terminal connected to said precharge signal input terminal of each of said plurality of dynamic CMOS registers;

a self-timed clock circuit including:

a self-timed clock CMOS PNN tier of FETs implemented on said die with each FET having a source, a drain and a gate, said self-timed clock CMOS PNN tier including:

a P channel FET having said source disposed to be connected to a positive bus voltage and said gate connected to said output terminal of said first inverter;

a first N channel FET having said drain connected to said drain of said P channel FET; and a second N channel FET having said drain connected to said source of said first N channel FET, said source disposed to be connected to ground, and said gate connected to said source of said P channel FET;

a second inverter having an input terminal and an output terminal with said input terminal connected to said drain of said P channel FET; and a NOR gate having a first input terminal, a second input terminal, and an output terminal, said first input terminal connected to said input terminal of said first inverter, said second input terminal connected to said output terminal of said second inverter, and said output terminal connected to said gate of said first N channel FET and each of said self-timed clock input terminals of each of said plurality of dynamic CMOS registers;

wherein a signal on said output terminal of said NOR gate, namely a self-timed clock pulse, is a positive going pulse having a duration time equal to the sum of the settling times of said fifth N channel FET, said second inverter and said NOR gate when said inverse clock signal makes a transition from a high signal level to a low signal level.

6. A dynamic CMOS die as in claim 5 wherein said self-timed clock CMOS tier is physically in close proximity on said die to each of said plurality of dynamic CMOS registers to facilitate a close match of the performance characteristics of said all of said CMOS PNN tiers.

7. A CMOS self-timed clock circuit comprising:

a first inverter having an input terminal and an output terminal with said input terminal disposed to receive an inverse clock signal;

a CMOS PNN tier of FETs with each FET having a source, a drain and a gate, said CMOS PNN tier including:

a P channel FET having said source disposed to be connected to a positive bus voltage and said gate connected to said output terminal of said first inverter;

a first N channel FET having said drain connected to said drain of said P channel FET; and a second N channel FET having said drain connected to said source of said first N channel FET, said source disposed to be connected to ground, and said gate connected to said source of said P channel FET;

a second inverter having an input terminal and an output terminal with said input terminal connected to said drain of said P channel FET; and a NOR gate having a first input terminal, a second input terminal, and an output terminal, said first input terminal connected to said input terminal of said first inverter, said second input terminal connected to said output terminal of said second inverter, and said output terminal connected to said gate of said first N channel FET;

wherein a signal on said output terminal of said NOR gate, namely a self-timed clock pulse, is a positive going pulse having a duration time equal to the sum of the settling times of said first N channel FET, said second inverter and said NOR gate when said inverse clock signal makes a transition from a high signal level to a low signal level.

* * * * *